(12) United States Patent
Kato et al.

(10) Patent No.: US 7,701,686 B2
(45) Date of Patent: Apr. 20, 2010

(54) POWER SUPPLY CONTROLLER

(75) Inventors: Masayuki Kato, Yokkaichi (JP); Isao Isshiki, Yokkaichi (JP); Seiji Takahashi, Yokkaichi (JP); Masahiko Furuichi, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 432 days.

(21) Appl. No.: 11/791,447

(22) PCT Filed: Nov. 30, 2005

(86) PCT No.: PCT/JP2005/021996

§ 371 (c)(1),
(2), (4) Date: May 24, 2007

(87) PCT Pub. No.: WO2006/059646

PCT Pub. Date: Jun. 8, 2006

(65) Prior Publication Data

US 2008/0002325 A1   Jan. 3, 2008

(30) Foreign Application Priority Data

Nov. 30, 2004   (JP)   ............................. 2004-346891

(51) Int. Cl.
*H02H 7/00*   (2006.01)
(52) U.S. Cl. ................................................... 361/93.1

(58) Field of Classification Search ................. 361/93.1
See application file for complete search history.

(56) References Cited

U.S. PATENT DOCUMENTS

| 6,831,821 B2 | 12/2004 | Ohshima |
| 7,369,386 B2 * | 5/2008 | Rasmussen et al. ........ 361/93.9 |
| 2002/0012216 A1 | 1/2002 | Ohshima |

FOREIGN PATENT DOCUMENTS

| DE | 601 00 831 T2 | 7/2004 |
| EP | 1 176 685 A1 | 1/2002 |
| JP | A 8-102649 | 4/1996 |
| JP | A 2001-217696 | 8/2001 |
| JP | A 2002-111465 | 4/2002 |

OTHER PUBLICATIONS

German Patent Office, *German Office Action*, dated: Nov. 19, 2009, received: Dec. 7, 2009; pp. 1-3; Germany.

* cited by examiner

*Primary Examiner*—Stephen W Jackson
(74) *Attorney, Agent, or Firm*—Oliff & Berridge, PLC

(57) ABSTRACT

In a power supply controller 10 having a self-protective mechanism for performing, intermittently or periodically, a forced ON-OFF operation which causes a power MOSFET 15 to perform an automatically restorable primary disconnecting operation and a restoring operation when an overcurrent anomaly or an short-circuiting anomaly is detected, an automatically unrestorable secondary disconnecting operation is performed when the accumulated amount of the duration of the forced ON-OFF operation reaches an accumulation threshold.

12 Claims, 6 Drawing Sheets

POWER SUPPLY CONTROLLER

TECHNICAL FIELD

The present invention relates to a power supply controller capable of protecting an external circuit connected to a semiconductor switch.

BACKGROUND ART

A power supply controller, in which a high-power semiconductor switching element such as a power MOSFET is disposed on a current supply line connected between a power source and a load, is conventionally provided. The power supply to the load is controlled by switching the semiconductor switching element between ON and OFF. In such a power supply controller, it is known that a self-protective function is provided for protecting its own switching element described above by controlling the potential of the control terminal of the semiconductor switching element so as to turn off the switching element in response to an occurrence of overcurrent. Specifically, as shown in JP-A-2001-217696, a current detecting resistor is serially connected to the load terminal (e.g., the source or drain in the case of a MOSFET). The voltage drop in the resistor is detected, and the occurrence of overcurrent is determined if the voltage drop is larger than a predetermined level.

The current blocking due to the above-described self-protective function is automatically restored, that is, the switching element is turned on again, when a predetermined time has elapsed after the blocking. This is because the function is provided to prevent the semiconductor switching element itself from overheating and, when the abnormal current is blocked, the temperature of the semiconductor switching element should be immediately lowered by a heat radiator conventionally provided therein.

For example, in case that short-circuiting has occurred in an external circuit, i.e., a load of the power supply controller, the above means that an ON-OFF operation, in which the semiconductor switching element is immediately tuned off in response to the short-circuiting current and thereafter turned on when the predetermined time has elapsed, is repeated. According to this, the semiconductor switching element is likely to overheat and thereby damaged depending on the radiating characteristics, or an electric wire or the like in the external circuit connected to this power supply controller may be burnt out. Therefore a fuse element is conventionally provided in the external circuit in consideration of its resistance and thermal property, and the circuit is generally disconnected by burning out the fuse element at the time of occurrence of short-circuiting current or the like so as not to be automatically restored.

However, the additionally provided fuse element results in an overall larger device. Thus, the problem arises that the above device fails to meet the recently growing demand of miniaturization of the device or integration in the circuit construction.

The present invention was made in view of the foregoing circumstances, and an object thereof is to provide a power supply controller capable of protecting an external circuit utilizing the self-protective function of a semiconductor switching element.

DISCLOSURE OF THE INVENTION

The present invention is a power supply controller disposed between a power source and a load for controlling the power supply from the power source to the load, including a semiconductor switching element disposed on the current path from said power source to said load, a current detecting element for detecting current passing through said semiconductor switching element, and an abnormal current detecting circuit for processing a signal from said current detecting element and thereby outputting an abnormal current signal if the current passing through said semiconductor switching element exceeds a predetermined threshold current. Further, the power supply controller includes an overcurrent protective circuit for causing the semiconductor switching element to perform a disconnecting operation of a predetermined reference OFF duration and thereafter restoring a conducting state, on a condition that a time elapsed after the output of said abnormal current signal reaches a predetermined reference ON duration. Further included are a load protective circuit for measuring an accumulated time of a sum of said reference ON duration and said reference OFF duration or the number of times of said disconnecting operation associated with repetition of disconnection and restoration of said semiconductor switching element due to said overcurrent protective circuit and causing said semiconductor switching element to perform a disconnecting operation on a condition that the measurement reaches a predetermined value, and a reset circuit for releasing a disconnecting state of said semiconductor switching element due to said load protective circuit based on an external signal and thereby restoring the conducting state.

A power supply controller according to the present invention protects the semiconductor switching element by operating the semiconductor switching element to perform a disconnecting operation in case that an abnormal current is detected during application of current to the load. After the disconnecting operation, the conducting state is restored, but a disconnecting operation is performed again in case that a new anomaly is detected and thereafter the conducting state is restored again. If the abnormal current is temporary, application of current to the load is maintained preventing temperature rise in the semiconductor switching element.

However, in an overcurrent state due to short-circuiting of the load or malfunction of the device, the above ON-OFF operation continues to a certain extent. The heat value of an external circuit (such as a wiring member or the load) connected to the semiconductor switching element during the ON-OFF operation depends on a duration of the forced ON-OFF operation of the semiconductor switching element (i.e., a sum of ON duration and OFF duration associated with the forced ON-OFF operation). Therefore the duration of the forced ON-OFF operation is accumulated, and the semiconductor switching element is operated to perform an automatically unrestorable disconnecting operation on a condition that the accumulated time reaches an accumulation threshold (e.g., a limited time corresponding to accumulated heat value in the case of burnout of the external circuit or the fear thereof). Alternatively the number of times of disconnecting operations may be counted instead of the above accumulated time.

In short, the power supply controller according to the present invention provides a fuse function for protecting the external circuit utilizing the inherent self-protective function. Further, according to such a construction, an automatically unrestorable disconnecting operation is ultimately performed if the forced ON-OFF operation is maintained, and therefore a short-circuiting failure or the like of the power supply controller itself due to thermal stress can be prevented.

EXPLANATION OF REFERENCE SYMBOLS

Figure 1:
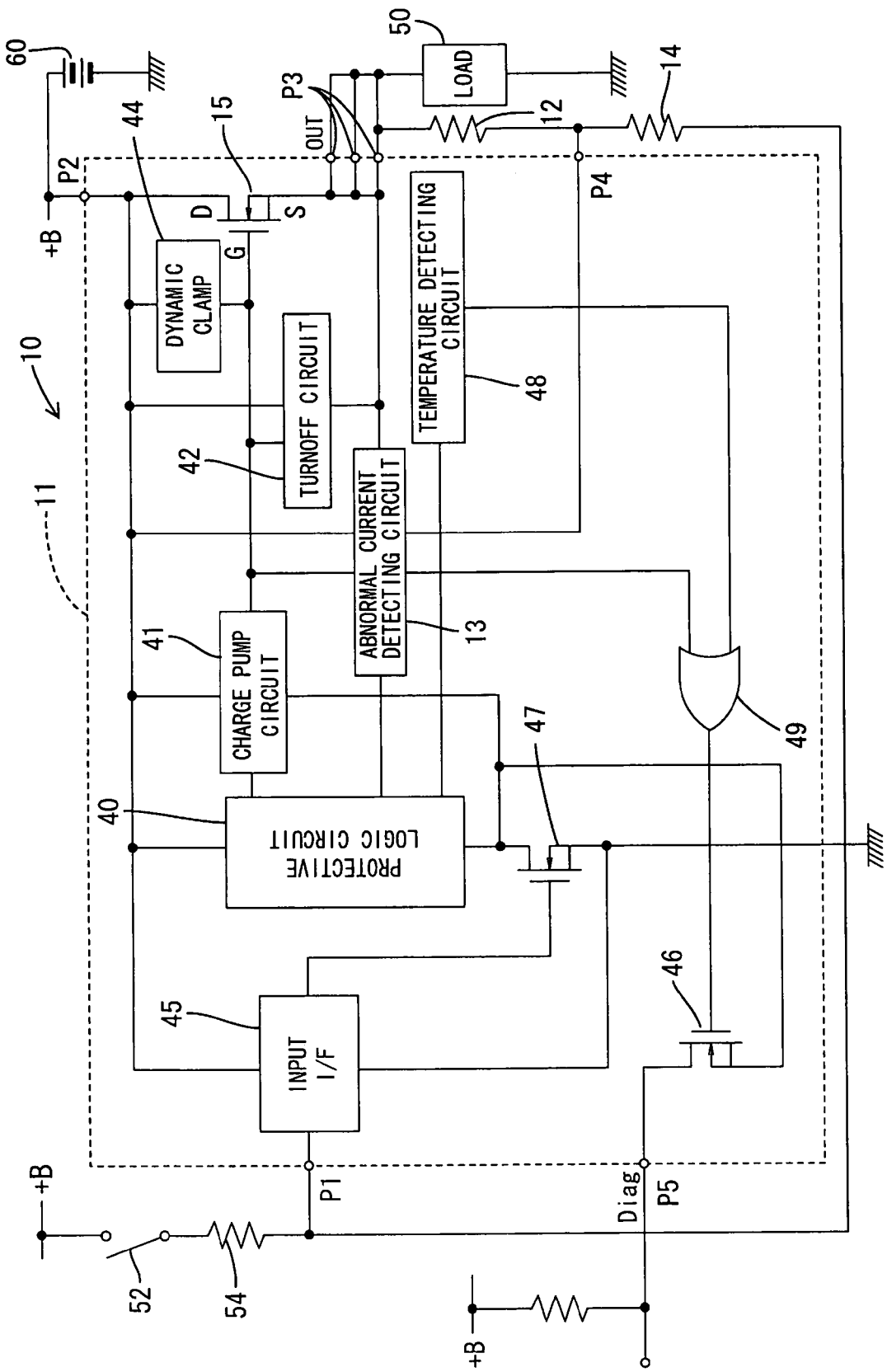
[FIG. 1] is a block diagram illustrating the general construction of a power supply controller according to the present invention.

10: power supply controller
11: semiconductor switching device
13: abnormal current detecting circuit
12: first external resistor
14: second external resistor
15: power MOSFET (power FET, semiconductor switching element)
16: sense MOSFET (sense FET, current detecting element)
38: Zener Diode
40: protective logic circuit (overcurrent protective circuit, load protective circuit)
P1: input terminal
P2: power-source-side output terminal
P3: load-side output terminal
P4: external resistance terminal
Ia: first threshold current (first threshold current value)
Ib: second threshold current (second threshold current value)

BEST MODE FOR CARRYING OUT THE INVENTION

An embodiment according to the present invention will be explained with reference to FIGS. 1 through 6.

(1) General Construction

FIG. 1 is a block diagram showing the general construction of a power supply controller according to the present embodiment. As shown in the figure, the power supply controller of the present embodiment is configured by connecting a power source 60, a load 50, first external resistors 12, 14, a reset switch 52 and the like on a one-chip semiconductor switching device 11, so as to control the power supply from the power source 60 to the load 50. The power supply controller 10 of the present embodiment is installed on a vehicle not shown, and may control a vehicle lamp, a cooling fan motor, a defogger heater or the like.

When the reset switch 52 connected to the input terminal P1 of the semiconductor switching device 11 is closed, an FET 47 is switched into the ON state via an input interface 45 and then a protective logic circuit 40 operates. An abnormal current detecting circuit 13 and a temperature detecting circuit 48 are connected to the input line of the protective logic circuit 40, while the gate G of a power MOSFET 15 corresponding to a semiconductor switching element is connected to the output line of the protective logic circuit 40 via a charge pump circuit 41 and a turnoff circuit 42

Figure 2:
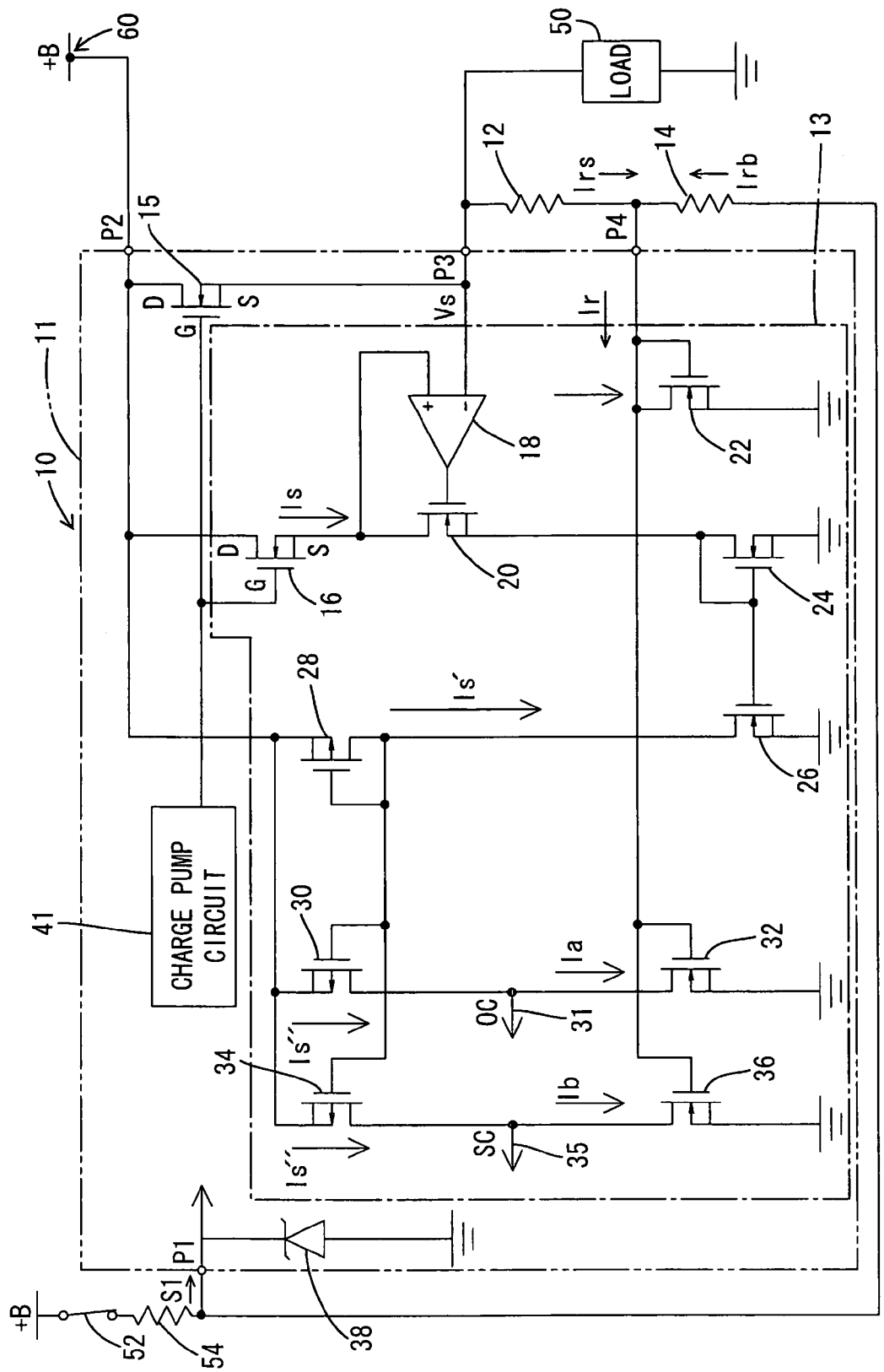
[FIG. 2] is a circuit diagram illustrating mainly the construction of an overcurrent detecting circuit (an anomaly detecting circuit) of the power supply controller shown in FIG. 1.

FIG. 2 is a circuit diagram showing mainly the abnormal current detecting circuit 13 of the semiconductor switching device 11. In the semiconductor switching device 11, the power MOSFET 15, a sense MOSFET 16 (corresponding to a current detecting element) through which a sense current having a predetermined relationship with (i.e., with a constant ratio to) a current of the power MOSFET 15 passes, and the abnormal current detecting circuit 13 for detecting a current anomaly in the power MOSFET 15 are configured with an overcurrent protective circuit, a load protective circuit and a reset circuit described below into a single chip or a plurality of chips housed in a package.

As for the power MOSFET 15, its drain terminal D is connected to the power-source-side terminal P2, while its source terminal S is connected to the load-side terminal P3. As for the sense MOSFET 16, its gate terminal G and drain terminal D are in common connection with the gate terminal G and drain terminal D of the power MOSFET 15. Further the source terminal S of the power MOSFET 15 and the source terminal S of the sense MOSFET 16 are connected respectively to two input terminals of an operational amplifier 18 and thereby maintained at the same potential each other. Thus it is configured so that currents, one with a constant current ratio to the other, pass through the power MOSFET 15 and sense MOSFET 16. The output side of the operational amplifier 18 is connected to the gate terminal of an FET 20.

The first external resistor 12 is disposed between the load-side output terminal P3 and the external resistance terminal P4 of the semiconductor switching device 11. The external resistance terminal P4 is connected to the drain terminal and gate terminal of an FET 22, and the source of the FET 22 is connected to the ground line. Therefore a current corresponding to a voltage level Vs at the source terminal S of the power MOSFET passes through the first external resistor 12 toward the ground line.

On the other hand, the second external resistor 14 is connected between the external resistance terminal P4 and the input terminal P1 of the semiconductor switching device 11, and the input terminal P1 is then connected to the power source 60 serially through a resistor 54 and the reset switch 52. Further the input terminal P1 of the semiconductor switching device 11 is connected to the ground line via a Zener Diode 38 internally formed in the semiconductor switching device 11. Therefore, when the reset switch 52 is closed, a voltage regulated to a constant due to the Zener Diode 38 appears at the input terminal P1 and, corresponding to this voltage, a constant current passes through the second external resistor 14, the external resistance terminal P4, and the FET 22. Therefore the total current Ir passing through the FET 22 is determined by adding a current Irs (i.e., a current that varies with the source voltage Vs of the power MOSFET 15) passing through the first external resistor 12 and the bias current Irb (i.e., a constant current) passing through the second external resistor 14. Hereinafter this current Ir may be called as a reference current. Note that the above Zener Diode 38 forms a part of the input interface 45 shown in FIG. 1.

The abnormal current detecting circuit 13, which is connected to the external resistance terminal P4, sets up two types of threshold currents Ia, Ib (described below) based on the above reference current Ir, and outputs anomaly signals OC, SC (described below) based on comparison between the threshold currents Ia, Ib and a sense current Is of the sense MOSFET 16.

In the abnormal current detecting circuit 13, a current mirror circuit is formed with an FET 24 and an FET 26, and therefore a mirror current Is' equivalent to the sense current Is passes through the FET 26. On the other hand, an FET 28 is serially connected to the above FET 26 and forms a mirror current circuit with an FET 30 and an FET 34 so that a mirror current Is" equivalent to the mirror current Is' passes through the FET 30 and the FET 34. That is, the mirror current Is" equivalent to the sense current Is passes through the FET 30 and the FET 34. Then the mirror current Is" is compared with the threshold currents Ia, Ib described below for anomaly detection.

On the other hand, the above-described FET 22 forms a current mirror circuit with an FET 32 and an FET 36. For example, it is configured so that the widths of the drain-to-source channels of the FET 22 and the FET 36 are equal to each other while the widths of the drain-to-source channels of the FET 32 and FET 22 are different from each other. Thus, in the present embodiment, a second threshold current Ib equivalent to the reference current Ir passes through the FET 36, while a first threshold current Ia with a ratio constant (e.g., ⅝ of Ib) to the reference current Ir (i.e., consequently to the second threshold current Ib) passes through the FET 32.

The abnormal current detecting circuit 13 includes a first anomaly detecting portion (i.e., a portion formed with the FET 30, the FET 32 and a detecting line 31) for detecting a first anomaly state, and a second anomaly detecting portion (i.e., a portion formed with the FET 34, the FET 36 and a detecting line 35) for detecting a second anomaly state.

In the first anomaly detecting portion including the FET 32, the first threshold current Ia, having a ratio constant (=5Ir/8) to the reference current Ir, is setup as described above. Therefore, if the sense current Is (specifically, the mirror current Is" of the sense current Is) exceeds the first threshold current Ia, the current difference passes out onto the detecting line 31 and forms a signal (the first anomaly signal OC) indicating an overcurrent state.

On the other hand, in the second anomaly detecting portion including the FET 36, the second threshold current Ib equal to the reference current Ir is set up as described above. Therefore, if the sense current Is (i.e., the mirror current Is") exceeds the second threshold current Ib, the current difference passes out onto the detecting line 35 and forms a signal (the second anomaly signal SC) indicating a short-circuiting state, i.e., occurrence of a larger current than that in the first anomaly state.

The above-described first anomaly signal OC and second anomaly signal SC are converted to voltage signals, and then inputted in parallel to the protective logic circuit 40 so that a protective operation described below is performed. The first anomaly signal OC and second anomaly signal SC are also inputted to an OR circuit 49. When any of the first anomaly signal OC, second anomaly signal SC and a third anomaly signal OT indicating a temperature anomaly from the over-temperature detecting circuit is inputted to the OR circuit 49, an FET 46 is turned on and thereby a signal indicating an anomaly to an external circuit is outputted from the signal output terminal P5 so that a warning lamp is lit, for example.

(2) Threshold Setup

Next, the threshold setup in the abnormal current detecting circuit 13 will be explained.

Figure 3:
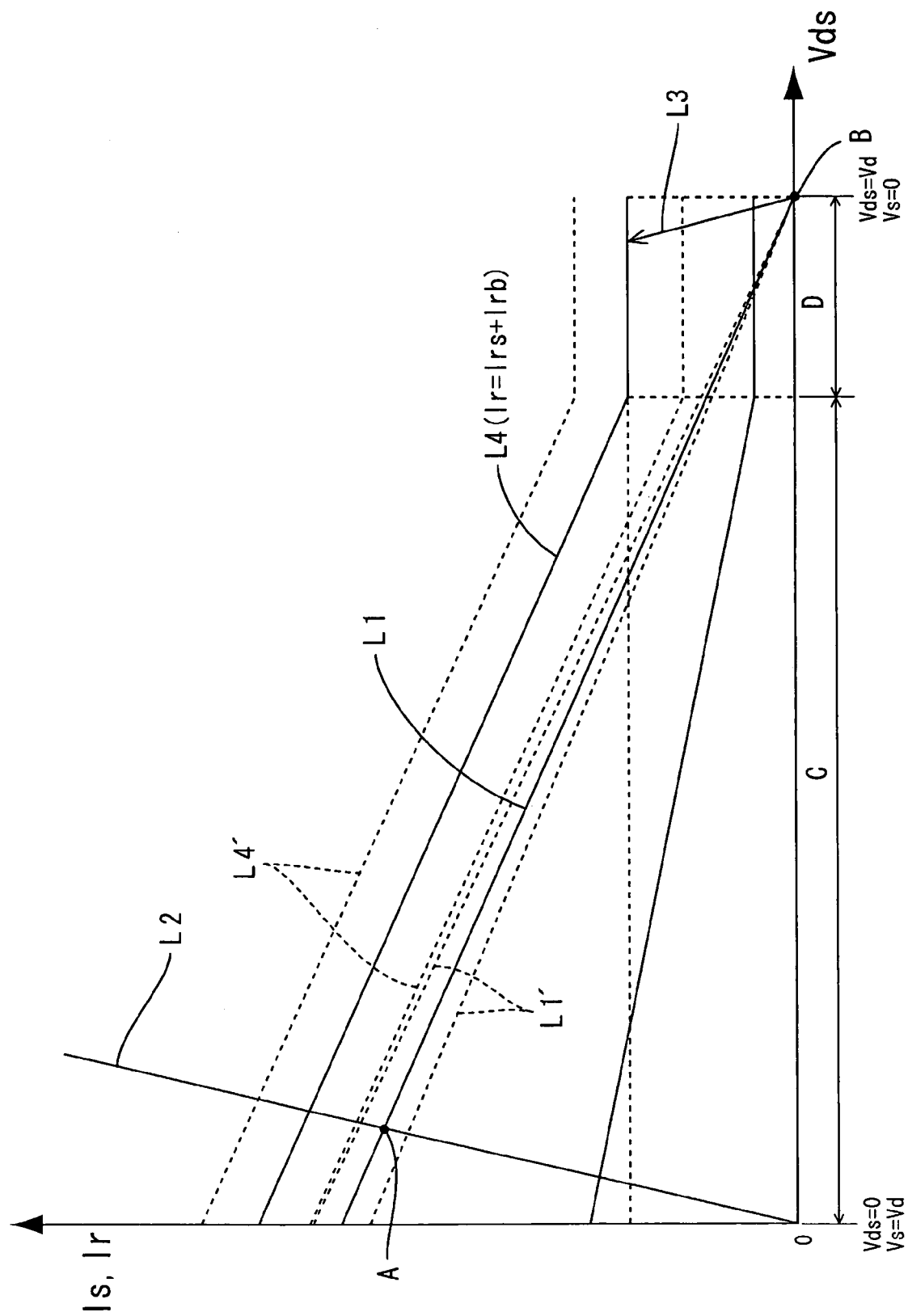
[FIG. 3] is a graph showing the relation between the drain-to-source voltage of a power MOSFET and individual currents.

FIG. 3 is a graph showing a relation between the drain-to-source voltage Vds of the sense MOSFET 16 and the sense current Is passing through the sense MOSFET 16. The horizontal axis represents the magnitude of the drain-to-source voltage Vds of the sense MOSFET 16, while the vertical axis represents the magnitude of the sense current Is and the reference current Ir. A line L1 is a load line showing the variation of the sense current Is determined based on the load resistance, and a line L2 is an ON-resistance line showing the variation of the sense current Is determined based on the ON resistance of the sense MOSFET 16.

In the case that the power MOSFET 15 is tuned on when the load 50 is in a normal state, the stabilization point of the drain-to-source voltage Vds and the current Is of the sense MOSFET 16 is the intersection A of the load line L1 and the ON-resistance line L2. That is, the drain-to-source voltage Vds and the current Is of the sense MOSFET 16 vary along with the load line L1 from a point B and then stabilize on arrival to the stabilization point (i.e., the intersection A), while the power MOSFET 15 is maintained in the ON state.

However, in case of anomaly such as short-circuiting in the load 50, the source voltage Vs of the power MOSFET 15 hardly rises although it starts from the point B at the time of start-up, because the voltage drop in the load 50 is extremely small. That is, the current Id passing through the power MOSFET 15 rapidly increases while the drain-to-source voltage of the power MOSFET 15 has little variation, corresponding to which the sense current Is rapidly increases after the start from point B as shown by a line L3.

Assuming that a current anomaly is detected when the sense current Is exceeds a threshold current determined as a constant value, the threshold current should be a larger value than the stabilization point A. Then it takes time to detect the current anomaly during the stage in which the source voltage Vs is low and the drain-to-source voltage Vds is high. Therefore, for detecting the current anomaly rapidly, it is desirable that the threshold current is low for the domain in which the drain-to-source voltage Vds is high, and then the threshold current changes higher for the domain in which Vds is lower.

Figure 4:
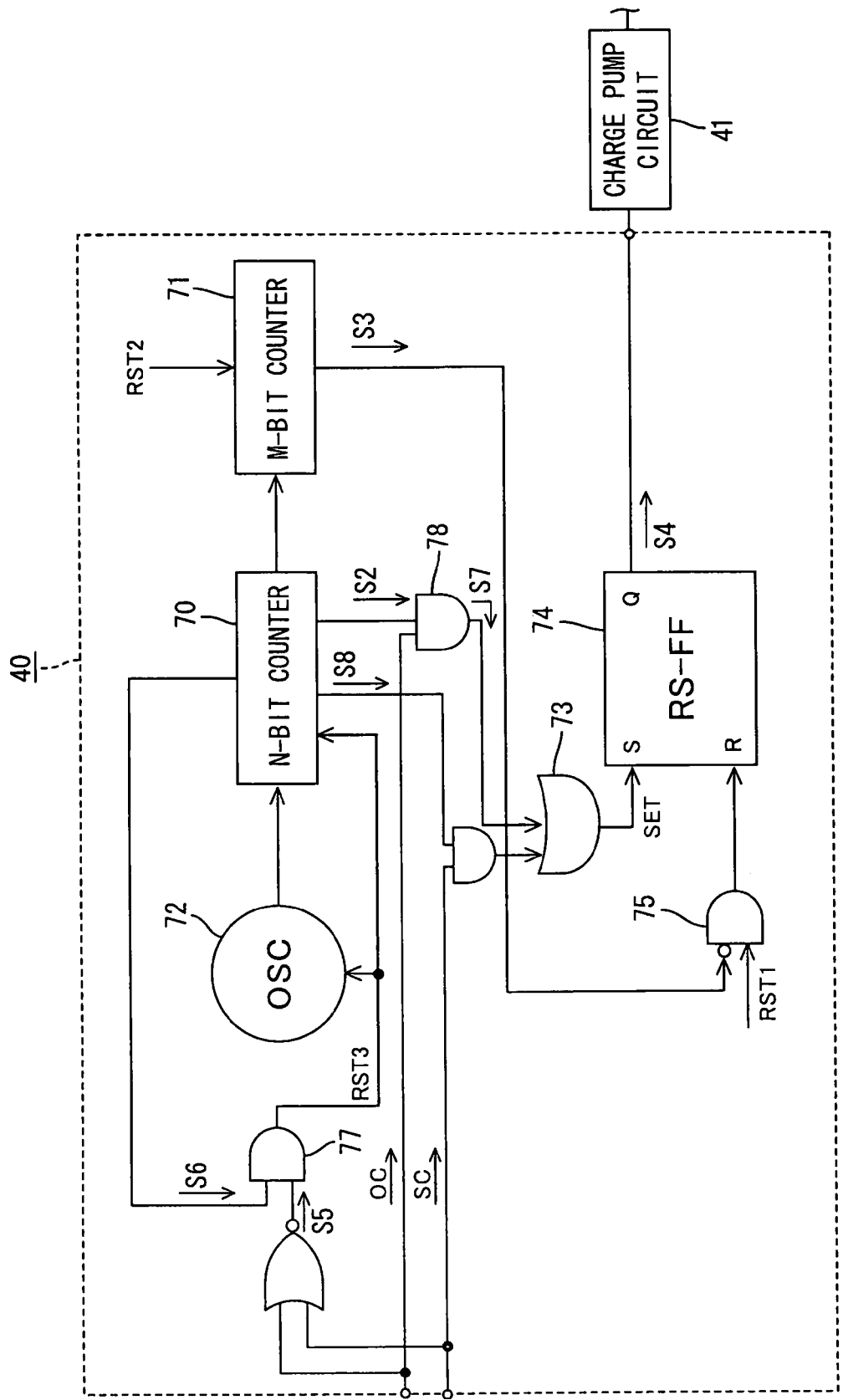
[FIG. 4] is a block diagram conceptually showing a protective logic circuit.
Figure 5:
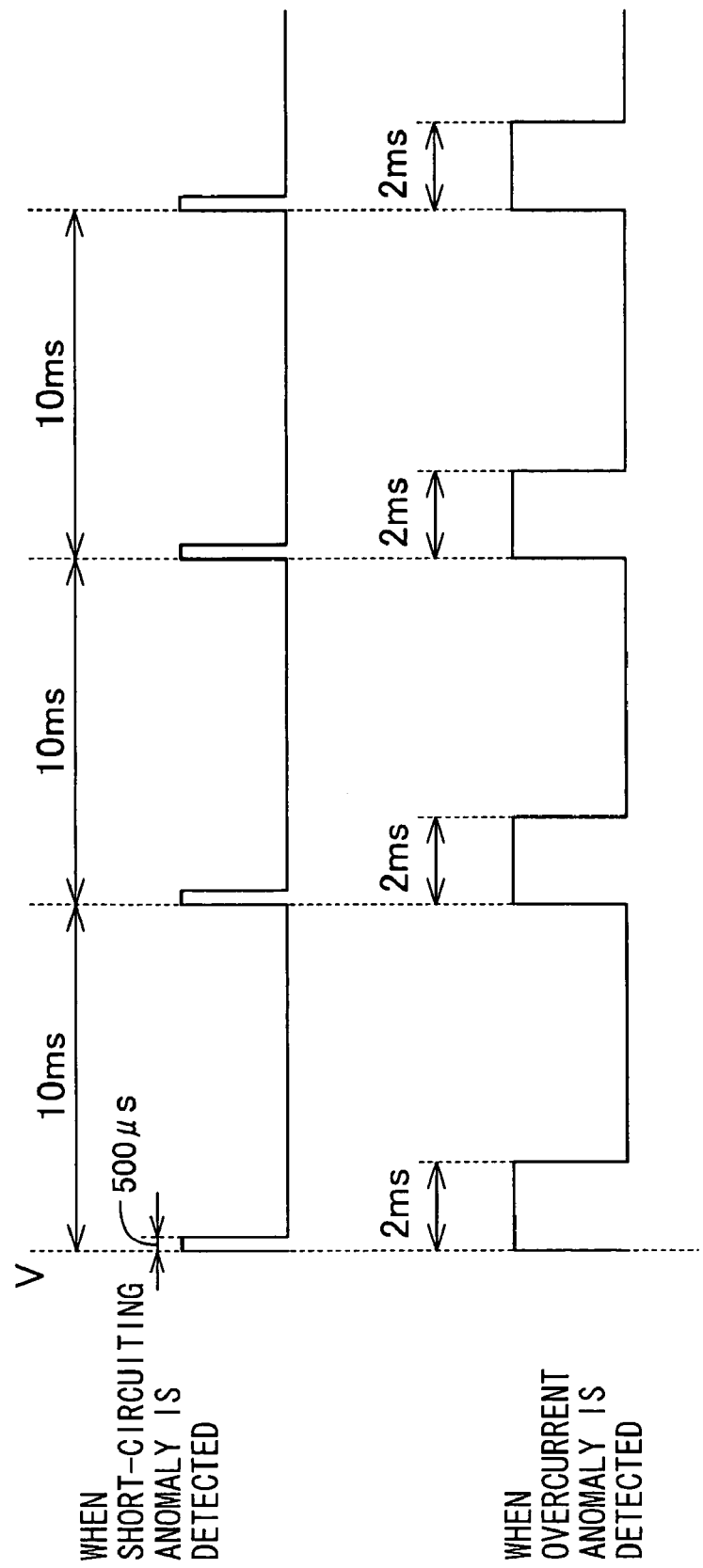
[FIG. 5] is a timing chart representing a control signal S4.

Consequently, in the present embodiment, the reference current Ir (furthermore, the threshold currents Ia, Ib determined depending thereon) is determined so as to vary along a slope substantially equivalent to the slope of the load line L1 as shown by a line L4 in FIG. 4. In order that the variation of the reference current Ir forms such a slope, the first external resistor 12 is connected between the load-side output terminal P3, which is connected to the source terminal S of the power MOSFET 15, and the external resistance terminal P4. The current Irs passing through the first external resistor 12, out of the reference current Ir (=Irs+Irb), varies linearly with the drain-to-source voltage Vds of the power MOSFET 15 so as to be low for the domain in which the voltage Vds is high and high for the domain in which the voltage Vds is low (domain C in FIG. 3).

However, for the domain (domain D in FIG. 3) in which the drain-to-source voltage Vds of the power MOSFET 15 is extremely high, the current Irs does not occur due to the Vds associated with the FET 22 having turned on, and then there is concern that the detection of the current anomaly is not stable. Therefore, in the present embodiment, the bias current Irb is added to the current Irs, and the result is used as the reference current Ir. Thereby, for the domain (domain D in FIG. 3) in which the Vds of the power MOSFET 15 is extremely high, the threshold current can be also appropriate. Thus the threshold current is set up more appropriately in comparison with the case that the threshold current is set as a constant value, and thereby the disconnecting operation can be performed rapidly with a small power loss in the power MOSFET 15.

In the present embodiment, assuming that the load line L1 is represented as Is=m*Vds+n (where m and n are constants) on the maximum load basis and in the case that the sense current Is is normal (i.e., there has been no anomaly state), the second threshold current Ib is set as Ib=m*Vds+s (where s is a constant) for the domain C. For the domain D, it is set as Ib=s (where s is a constant). Further the slope of Ib is determined by Vs/Rs, and therefore the slope of the load line L1 and the slope of the threshold current line L4 can be set to be equivalent for the domain C by adjusting the resistance Rs of the first external resistor 12. Meanwhile, the bias reference current Irb can be set up by adjusting the resistance Rb of the second external resistor 14.

Although the setup principle for the second threshold current Ib has been explained with reference to FIG. 3, the first threshold current Ia can be set up similarly. Note that a line representing the first threshold current Ia has an analogous shape to the line representing the second threshold current Ib, since the first threshold current Ia has a predetermined ratio to the second threshold current Ib.

Meanwhile, the precision of setup of the threshold currents Ia, Ib is determined depending upon the precision of the resistors 12, 14. Therefore, if the resistors 12, 13 are supposedly incorporated in the semiconductor switching device 11, the wide variation of the resistance due to a semiconductor manufacturing process can directly cause errors in the threshold currents Ia, Ib and eventually lower the precision of anomaly detection. In contrast to this, in the present embodiment, the resistors 12, 14 for the threshold setup are not disposed inside, but outside the semiconductor switching device 11 as the external resistors 12, 14. Therefore, compared with the case of the resistors formed in the semiconductor manufacturing process, external resistors of a dramatically high precision can be used, and correspondingly the threshold currents Ia, Ib can be set up with a higher precision. Note that the variation of the threshold currents Ia, Ib means that the line L4 in FIG. 3 varies between two broken lines L4', for example.

Thus in the present embodiment, the threshold currents Ia, Ib can be set up with a high precision, while the mirror current Is", which is generated by the current mirror circuits and compared with the threshold currents Ia, Ib, precisely reflects the sense current Is with little variation (See broken lines L1' representing the variation). Thus the currents, both of which are highly precise, can be compared to each other, and therefore the precision of anomaly detection can be extremely high. Further, the threshold currents Ia, Ib can be set to increase or decrease corresponding to increase or decrease of the voltage Vs at the source terminal S of the power MOSFET 15 (more specifically, they are set up so that the slope of the line L4 corresponding to the threshold current is equal to the slope of the load line L1 for most of the domain, and also set up appropriately for the rest of the domain). Therefore, when short-circuiting occurs, the level of the sense current immediately reaches the threshold current level and therefore the protection is rapidly performed, compared to the configuration in which the threshold value is set uniformly to a constant level for the whole domain.

(3) Protective Logic Circuit

The construction of the protective logic circuit 40 is shown in FIG. 4. This protective logic circuit 40 normally activates the charge pump circuit 41. The charge pump circuit 41 operates to apply a raised voltage to between the gate and source of the power MOSFET 15 and the sense MOSFET 16 each, and thereby turns each on, i.e., switches into the conducting state. On the other hand, when anomaly is detected, that is, the above first anomaly signal OC or second anomaly signal SC is received, the protective logic circuit 40 outputs a control signal S4 for switching off the charge pump circuit 41 and activating the turnoff circuit 42, and thereby functions as an overcurrent protective circuit and a load protective circuit which cause a disconnecting operation by releasing the charge between the gate and source of the power MOSFET 15 and sense MOSFET 16 each.

The protective logic circuit 40 includes an oscillator 72 (OSC), an N-bit counter circuit 70, an M-bit counter circuit 71, a NOR circuit 76, an AND circuit 77 and the like. The first anomaly signal OC and second anomaly signal SC are inputted to the NOR circuit 76 among others. Then a signal S5 from the NOR circuit 76 and a signal S6, which is outputted from the N-bit counter circuit 70 when its count is the initial value (N=0), are inputted to the AND circuit 77. A reset signal RST3 from the AND circuit 77 is applied to the oscillator 72 and the N-bit counter circuit 70 for initializing them.

According to such a construction, the oscillator 72 and the N-bit counter circuit 70 wait in the reset state until the protective logic circuit 40 receives the first anomaly signal OC or the second anomaly signal SC. Thereafter, if the first anomaly signal OC or the second anomaly signal SC is received, the oscillator 72 and the N-bit counter circuit 70 are released from the reset state. That is, the N-bit counter circuit 70 begins to count up for a period of time (e.g., 10 milliseconds in the present embodiment) corresponding to N bits according to the oscillating frequency of the oscillator 72. After N bits have been counted, it is reset to restart the count of N bits. The oscillator 72 and the N-bit counter 70 are configured to be reset if the protective logic circuit 40 has received neither the first anomaly signal OC nor the second anomaly signal SC and the count of the N-bit counter circuit 70 is zero. Therefore, once the protective logic circuit 40 receives the first anomaly signal OC or the second anomaly signal SC, the N-bit counter circuit 70 thereafter continues to count up until the count of N bits is complete, regardless of whether the first anomaly signal OC or the second anomaly signal SC has been received again.

Further, the N-bit counter circuit 70 outputs an output signal S8 at the end of the count of k(<N) bits (e.g., corresponding to 500 microseconds in the present embodiment). Then this output signal S8 and the second anomaly signal SC are applied to an AND circuit 79. In conclusion, if the second anomaly signal SC is inputted to the protective logic circuit 40 and thereby the N-bit counter circuit 70 starts to count up, the AND circuit 79 outputs an output signal S9 after the count of k(<N) bits is complete.

Moreover, the N-bit counter circuit 70 outputs an output signal S2 at the end of the count of h (k<h<N) bits (e.g., corresponding to 2 milliseconds in the present embodiment). Then this output signal S2 and the first anomaly signal OC are applied to an AND circuit 78. In conclusion, if the first anomaly signal OC is inputted to the protective logic circuit 40 and thereby the N-bit counter circuit 70 starts to count up, the AND circuit 78 outputs an output signal S7 after the count of h (k<h<N) bits is complete.

The M-bit counter circuit 71 counts the number of times overflow occurs (i.e., completion of the N-bit count) in the N-bit counter circuit 70 up to M bits. The M-bit counter circuit 71, having its counter reset by a reset signal RST2 received when the control signal S1 is inputted to the input terminal (e.g., when a load activation signal is inputted), normally outputs an output signal S3 of a low level, but here has an output signal S3 of a high level or an inverted signal at the time of overflow (i.e., the end of the M-bit count). In M-bit counter circuit 71, its counter is reset only when the reset signal RST2 is received due to the control signal S1 (e.g., the load activation signal) inputted to the input terminal.

The protective logic circuit 40 further includes an RS-FF 74 (an RS flip-flop) that provides the control signal S4 for the charge pump circuit 41 so as to cause the ON-OFF operation.

In this RS-FF 74, a set signal SET from an OR circuit 73 is inputted to its set terminal S while a reset signal RST1 is inputted to its reset terminal R, and the respective input terminals of the charge pump circuit 41 and the turnoff circuit 42 are connected to its output terminal Q.

In the reset state, the RS-FF 74 outputs the control signal S4 of a low level from the output terminal Q so that the charge pump circuit 41 is turned on and the turnoff circuit 42 is turned off. Thereby the power MOSFET 15 and the sense MOSFET 16 switch into the conducting state due to a raised voltage signal received from the charge pump circuit 41. If the set signal SET is inputted in this reset state, the charge pump circuit 41 is turned off and the turnoff circuit 42 is turned on. Thereby the power MOSFET 15 and the sense MOSFET 16 switch into the disconnecting state, i.e., turn off, since the charge between the gate and source of each is released.

The output signal S7 from the above AND circuit 78 and the output signal S9 from the AND circuit 79 are inputted to the OR circuit 73. Therefore the OR circuit 73 provides the set signal SET for the RS-FF 74, when 2 milliseconds have elapsed after detection of an overcurrent state (i.e., after output of the first anomaly signal OC) or 500 microseconds have elapsed after detection of a short-circuiting state (i.e., after output of the second anomaly signal SC).

The inverted signal of the signal S3 outputted from the M-bit counter circuit 71 and the reset signal RST1 are inputted to an AND circuit 75. That is, the AND circuit 75 functions as an activation means, which activates the reset signal RS1 and thereby provides it for the reset terminal R of the RS-FF 74 when a low-level output signal is received from the M-bit counter circuit 71, but deactivates the reset signal RST1 and thereby prevents provision of the reset signal RST1 for the reset terminal R of the RS-FF 74 when a high-level output signal is received from the M-bit counter circuit 71.

Meanwhile, the reset signal RST1 is outputted when the control signal S1 is inputted to the input terminal or the counter of the N-bit counter circuit 70 is the initial value (N=0).

(Operation)

<In the Case of Short-Circuiting Anomaly>

According to the above construction, the protective logic circuit 40 turns on the power MOSFET 15 and the sense MOSFET 16 into the conducting state by the RS-FF 74, when the control signal S1 is inputted to the input terminal. The N-bit counter circuit 70 starts to count up when the second anomaly signal SC is received, for example. Thereafter, if the N-bit counter circuit 70 completes the k-bit count and then the short-circuiting state still continues, the RS-FF 74 transfers to a set state and thereby turns off the power MOSFET 15 and the sense MOSFET 16 so that a disconnecting operation is forcibly performed. The time, from when the second anomaly signal SC is received till the above disconnecting operation is performed, corresponds to the reference ON duration of the present invention, which is 500 microseconds in this embodiment.

The disconnecting operation in this case is an automatically restorable disconnecting operation (hereinafter, sometimes referred to as a primary disconnecting operation). That is, the reset signal RST1 is outputted when the counter of the N-bit counter circuit 70 is initialized to zero due to overflow, and then the reset signal RST1 is activated in the AND circuit 75. Thereby the RS-FF 74 transfers to the reset state, and then restores the power MOSFET 15 and the sense MOSFET 16 to the conducting state.

If the load 50 remains in the short-circuiting state at the time of restoration of the conducting state, the above-described primary disconnecting operation is performed again when the protective logic circuit 40 receives the second anomaly signal SC. Therefore, unless the short-circuiting state is resolved, the RS-FF 74 outputs, as a control signal S4 (with a duty ratio of 5%), a high-level signal (i.e., a signal for turning on the power MOSFET 15 or the like into the conducting state) of a duration (i.e., a pulse width) of 500 microseconds on a 10-millisecond cycle to the gate G of the power MOSFET 15 and the sense MOSFET 16 via the charge pump circuit 41 as shown in FIG. 5(A), so that the ON-OFF operation is forcibly performed. Note that the duration, during which the above primary disconnecting operation is performed, corresponds to the reference OFF duration of the present invention, which is 9.5 milliseconds in the present embodiment. The sum of the above reference ON duration and reference OFF duration corresponds to the above-described cycle time (i.e., 10 milliseconds).

The M-bit counter circuit 71 counts the number of forced ON-OFF operations, that is, the number of times of overflow in the N-bit counter circuit 70, and outputs a high-level signal when the count reaches M. According to this, the AND circuit 75 deactivates the reset signal RST1, so that the RS-FF 74 does not transfer to the reset state even when the N-bit counter circuit 70 thereafter overflows. The disconnecting operation in this case is an automatically unrestorable disconnecting operation (hereinafter, sometimes referred to as a secondary disconnecting operation).

<In the Case of Overcurrent Anomaly>

On the other hand, when the protective logic circuit 40 receives the first anomaly signal OC, the N-bit counter circuit 70 starts to count up, and thereafter, if the N-bit counter circuit 70 completes the h-bit count (i.e., 2 milliseconds later) and then the overcurrent state still continues, the above primary disconnecting operation is performed. Thereafter the reset signal RST1 is outputted, when the N-bit counter circuit 70 overflows and is initialized to zero. Then the RS-FF 74 transfers to the reset state, and thereby restores the power MOSFET 15 and the sense MOSFET 16 to the conducting state. If the overcurrent state still continues at the time of restoration to the conducting state, the above primary disconnecting operation is performed again when the protective logic circuit 40 receives the first anomaly signal OC. Therefore, unless the overcurrent state is resolved, the RS-FF 74 outputs, as a control signal S4 (with a duty ratio of 20%), a high-level signal of a duration (i.e., a pulse width) of 2 milliseconds on a 10-millisecond cycle to the gate G of the power MOSFET 15 and sense MOSFET 16 via the charge pump circuit 41 as shown in FIG. 5(B), so that the forced ON-OFF operation is performed.

Further the M-bit counter circuit 71 counts the number of forced ON-OFF operations, that is, the number of times of overflow in the N-bit counter circuit 70 likewise, and outputs a high-level signal when the count reaches M. According to this, the AND circuit 75 deactivates the reset signal RST1, and thereby the above secondary disconnecting operation is performed so that the RS-FF 74 does not transfer to the reset state even when the N-bit counter circuit 70 thereafter overflows.

<Method for Determining Threshold Current Values and Duty Ratios>

Next, a method for determining a first threshold current value Ia and a first duty ratio D (Da) associated with the forced ON-OFF operation for the case of overcurrent anomaly, and a second threshold current value Ib and a second duty ratio D (Db) associated with the forced ON-OFF operation for the case of short-circuiting anomaly will be explained.

Figure 6:
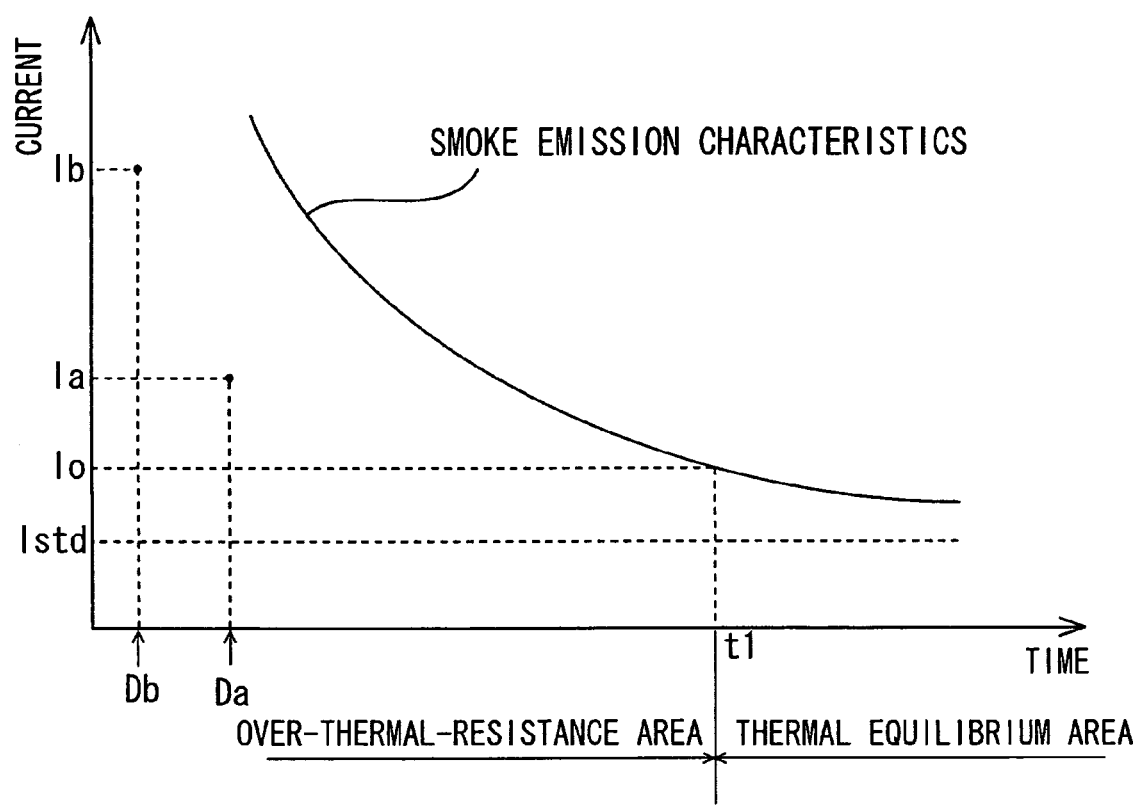
[FIG. 6] is a graph representing smoke emission characteristics.

FIG. 6 is a graph representing the smoke emission characteristics of an electric wire included in an external circuit likely connected to the power supply controller 10 of the present embodiment. This shows the relation between a time taken for the coating material of the above electric wire to emit smoke and a current value in the case that an arbitrary constant current is temporarily applied to the electric wire.

In the graph, Istd represents the rated current, and Io represents the equilibrium critical current that can be applied while maintaining a thermal equilibrium state in which heat generation and radiation in the electric wire are balanced. If a current of a higher level than the equilibrium critical current Io is applied, that relates to the over-thermal-resistance area in which the current level and the time taken for smoke emission are substantially in inverse proportion to each other. In the case of the present embodiment in which the duty-ratio control, i.e., the forcing ON-OFF control, of the power MOSFET 15 and the like is performed when a current anomaly is detected, the individual threshold currents and duty ratios should be determined based on the above equilibrium critical current Io associated with the thermal equilibrium state The total heating value during the time t1 taken for the electric wire to fuse in the case that the equilibrium critical current Io is applied as a constant is proportional to the square of the equilibrium critical current Io. The maximum allowable current level Imax in the case when a current is applied with a duty ratio D can be determined according to the following formula 1.

$$Imax = Io/\sqrt{D}$$

Then the first threshold current value Ia and the second threshold current value Ib for the abnormal current detecting circuit 13 should be set so that the current passing through the power MOSFET 15 is equal to or less than the maximum allowable current level Imax. In addition, in the case of a load through which inrush current passes, it is desirable to set the individual threshold currents Ia, Ib to a larger value than the sense current Is at the time of the inrush current. At least the second threshold current value Ib should be set to a larger value than a value corresponding to the inrush current. In view of this, in the present embodiment, the first duty ratio Da for the overcurrent anomaly is set to 20%, and the maximum of the first threshold current value Ia is set to a value equal to or less than Imax derived according to the above formula 1. Further the second duty ratio Db for the short-circuiting anomaly is set to 5%, and the maximum of the second threshold current value Ib is set to a value equal to or less than Imax derived according to the above formula 1.

Moreover, for both of the overcurrent anomaly and the short-circuiting anomaly, one cycle of the forced ON-OFF operation is set to the same value, i.e., 10 milliseconds, and thereby the construction of the counters can be extremely simple. Furthermore the first threshold current value Ia and the second threshold current value Ib are adjusted so that the first threshold current value Ia multiplied by the first duty ratio Da is equal to the second threshold current value Ib multiplied by the second duty ratio Db. The adjustment of the individual duty ratios is implemented by altering the above-described bit count k, h associated with outputting of the output signals S2, S8 of the N-bit counter circuit 70.

The smoke emission characteristics is different depending on an external circuit (a wiring member such as an electric wire, or a load) connected to the power supply controller 10, corresponding to which a desirable threshold current is also different. However, adjustment of the threshold currents is readily implemented by altering the resistance value of the above-described first external resistors 12, 14.

The count M (threshold number of times) of the M-bit counter circuit 71 can be determined as the fusing time t1, associated with the equilibrium critical current Io (constant current), divided by the cycle time (i.e., the sum of the ON duration and the OFF duration) of the above forced ON-OFF operation. Thus the count M should be determined so that the accumulated ON duration of the repetitive forced ON-OFF operation does not exceed the above fusing time t1 associated with the equilibrium critical current Io (constant current).

The forced ON-OFF operation is thus performed, on the same cycle for the overcurrent anomaly and the short-circuiting anomaly, with the duty ratios (Da, Db) corresponding to the threshold current values (Ia, Ib) of the respective current anomalies. Thereby the secondary disconnecting operation can be performed based on the count of the common M-bit counter circuit 71 in either current anomaly. Thus, the power supply controller 10 according to the present embodiment includes a self-protective function for performing an automatically restorable primary disconnecting operation when a current anomaly is detected, and further includes a fuse function (i.e., an external circuit protective function) for performing an automatically unrestorable secondary disconnecting operation before an electric wire or the like when heat is accumulated due to the current anomaly is burnt out.

After the automatically unrestorable secondary disconnecting operation is performed, if the reset switch 52 is once opened and turned on again, the reset signal RST2 is inputted to the M-bit counter circuit 71 from a reset signal generating circuit (not shown) disposed in the input I/F circuit 45, and thereby the initial state is restored so that the power MOSFET 15 returns to the conducting state. That is, the input I/F circuit 45 functions as a reset circuit for releasing, in the load protective circuit, the disconnecting state relevant to the semiconductor switching element so that the conducting state is restored.

Other Embodiments

The present invention is not limited to the embodiment explained in the above description with reference to the drawings, but the following embodiments may be included in the technical scope of the present invention, for example. Further the present invention may be embodied in various modified forms other than the following without departing from the scope of the present invention.

(1) In the above embodiment, two threshold current values Ia, Ib are provided corresponding to two types of current anomalies (i.e., a short-circuiting anomaly and an overcurrent anomaly), but the present invention is not limited to this construction. A plurality of levels of threshold current values may be provided corresponding to one type or more than two types of current anomalies so that the individual current anomaly can be detected.

(2) In the above embodiment, the values of the threshold current value multiplied by the duty ratio are set to be equal to each other for the respective forced ON-OFF operations at the time of the short-circuiting anomaly and the overcurrent anomaly, and thereby accumulation for implementing the external circuit protective function (i.e., the fuse function) can be performed using a single M-bit counter circuit 71. However the present invention is not limited to this construction. The duration of the forced ON-OFF operation may be independently accumulated based on the threshold current value and the duty ratio for the respective current anomalies. In this case, a plurality of counter means acting as the M-bit counter circuit 71 should be used. Further, accumulation of the duration of the forced ON-OFF operation may be implemented using an integration circuit or the like.

(3) Annunciation means may be included for indicating externally that the primary disconnecting operation or the secondary disconnecting operation is being performed. Such a construction can be implemented by outputting a signal based on the source voltage of the power MOSFET 15 or the sense MOSFET 16, for example. In this case, a signal line for outputting the signal should be additionally provided.

(4) In the above embodiment, whether the forced ON-OFF operation is performed consecutively or with interruption, the duration (i.e., the number of times of overflow (completion of the N-bit count) in the N-bit counter circuit 70) is accumulated for all the forced ON-OFF operations, and the secondary disconnecting operation is performed when the accumulation reaches the predetermined accumulation threshold. However the present invention is not limited to this construction. The secondary disconnecting operation may be performed when the consecutively accumulated duration (i.e., the number of consecutive completion of count) of forced ON-OFF operations performed without interruption reaches a predetermined accumulation threshold.

(5) Moreover, in an overcurrent state or a short-circuiting state, the time to restore to the conducting state after a primary disconnecting operation may be constant, but is not necessary to be constant.

(6) In the above embodiment, the constant-voltage circuit for generating the bias current Irb is implemented using the Zener Diode, but not limited to this construction. The constant voltage may be generated using a diode-connected FET, that is, an FET having a common connection between its gate and drain. In this case, a lower voltage (i.e., a smaller bias current Irb) can be obtained.

(7) In the above embodiment, the sense MOSFET 16 is used as the current detecting means. However, it is not necessary to directly detect the amount of current passing through the semiconductor switch, but rather that may be detected indirectly. For example, the following constructions (a)-(c) may be included:

(a) A construction in which a shunt resistor connected to the output of the semiconductor switch is provided and the current amount of the semiconductor switch is detected based on the load voltage of the shunt resistor;

(b) A construction in which the current amount of the semiconductor switch is detected based on the voltage level at the output terminal (e.g., the source electrode in the case of the MOSFET) of the semiconductor switch; and (c) A construction in which the current amount of the semiconductor switch is detected based on the ON resistance (e.g., the drain-to-source resistance value in the ON state in the case of the MOSFET) of the semiconductor switch.

The invention claimed is:

1. A power supply controller disposed between a power source and a load for controlling power supply from said power source to said load, comprising:
a semiconductor switching element disposed on a current path from said power source to said load;
a current detecting element capable of detecting a current passing through said semiconductor switching element;
an abnormal current detecting circuit for processing a signal from said current detecting element and thereby outputting an abnormal current signal if the current passing through said semiconductor switching element exceeds a predetermined threshold current;
an overcurrent protective circuit for causing said semiconductor switching element to perform a disconnecting operation of a predetermined reference OFF duration and thereafter restoring a conducting state when a time has elapsed after the output of said abnormal current signal reaches a predetermined reference ON duration;
a load protective circuit capable of measuring at least one of an accumulated time of a sum of said reference ON duration and said reference OFF duration or a number of times of said disconnecting operation associated with repetition of disconnection and restoration of said semiconductor switching element due to said overcurrent protective circuit, and causing said semiconductor switching element to perform a disconnecting operation on a condition that the measurement reaches a predetermined value; and
a reset circuit for releasing a disconnecting state of said semiconductor switching element due to said load protective circuit based on an external signal and thereby restoring a conducting state.

2. A power supply controller as claim 1, wherein said semiconductor switching element is a power FET.

3. A power supply controller as in claim 2, wherein said current detecting element is a sense FET through which a sense current having a predetermined relationship with a load current passing through said power FET.

4. A power supply controller as in claim 3, wherein said abnormal current detecting circuit is configured to detect an anomaly of current passing through said power FET based on said sense current and said predetermined threshold current.

5. A power supply controller as in claim 4, further including a pair of external terminals for connecting an external resistor, depending on which said threshold current in said abnormal current detecting circuit is determined, are provided.

6. A power supply controller as in claim 5, wherein one of said external terminals for connecting said external resistor is in common with a load-side output terminal for connecting said power FET to a load.

7. A power supply controller as in claim 6, wherein a current according to a potential at said load-side output terminal is applied to the other of said external terminals, so that said threshold current varies depending on a potential at said load-side output terminal.

8. A power supply controller as in claim 7, wherein a plurality of threshold currents of different values are set in said abnormal current detecting circuit.

9. A power supply controller as in claim 8, wherein said reference ON duration in said overcurrent protective circuit is set to be smaller corresponding to a larger threshold current.

10. A power supply controller as in claim 9, wherein a cycle time taken to disconnect said semiconductor switching element in response to the output of said abnormal current signal and thereafter restore to a conducting state is set to the same irrespective of a value of said threshold current.

11. A power supply controller as in claim 10, wherein said power FET, said sense FET and said abnormal current detecting circuit are configured onto a single chip or a plurality of chips housed in a package.

12. A power supply controller as claim 11, wherein said overcurrent protective circuit, said load protective circuit and said reset circuit are configured onto the single chip or the plurality of chips housed in a package.

* * * * *